United States Patent
Lin

(10) Patent No.: US 8,985,527 B2
(45) Date of Patent: Mar. 24, 2015

(54) ARM-ANCHORED COLLAPSIBLE BRACKET FOR HOLDING RACK-MOUNTABLE EQUIPMENT

(75) Inventor: Mike Lin, Newport Coast, CA (US)

(73) Assignee: ICC Corporation, Fullerton, CA (US)

( * ) Notice: Subject to any disclaimer, the term of this patent is extended or adjusted under 35 U.S.C. 154(b) by 824 days.

(21) Appl. No.: 13/228,693

(22) Filed: Sep. 9, 2011

(65) Prior Publication Data

US 2013/0062475 A1  Mar. 14, 2013

(51) Int. Cl.
*F16L 3/00* (2006.01)
*H05K 7/18* (2006.01)

(52) U.S. Cl.
CPC .................................... *H05K 7/18* (2013.01)
USPC ............. 248/49; 248/68.1; 361/823; 439/713

(58) Field of Classification Search
USPC ............... 248/49, 56, 57, 67.7, 68.1, 70, 201, 248/675, 906; 361/823, 826, 829; 211/26, 211/99; 439/713
See application file for complete search history.

(56) References Cited

U.S. PATENT DOCUMENTS

| | | | |
|---|---|---|---|
| 2,661,483 A * | 12/1953 | Tortorice | ........................... 4/695 |
| 3,606,217 A * | 9/1971 | Leiferman | ......................... 4/695 |
| 5,546,716 A * | 8/1996 | Broxterman et al. | ......... 52/220.1 |
| 5,765,698 A | 6/1998 | Bullivant | |
| 5,836,551 A | 11/1998 | Orlando | |
| 5,975,962 A | 11/1999 | Laukonis | |

OTHER PUBLICATIONS

New HPM-CAN Economical Adjustable Hinged Panel Mount, Middle Atlantic Products (Canada) Inc., Aug. 2009, 2 pgs., Canada.

* cited by examiner

*Primary Examiner* — Gwendolyn W Baxter

(74) *Attorney, Agent, or Firm* — Christie, Parker & Hale, LLP

(57) ABSTRACT

A bracket supports the weight of stand-off standard-width rack-mount equipment and can collapse flat for storage or shipping. An embodiment comprises a back member along the bracket's mounting plane and two stand-off arms each having portions extending along the plane and extending normal to it. Each arm moveably attaches to permit positioning the arm when the bracket is not installed so as to decrease the arm's normal dimension, and each arm comprises at least one anchor permitting attachment to a supporting structure. Another embodiment concerns a method of installing a bracket with a back member and moveably connected stand-off arms, comprising moving each arm in a manner that increases the arm's extension in a direction normal to the mounting plane, and attaching to at least one supporting structure each stand-off arm at at least one anchor.

20 Claims, 5 Drawing Sheets

ARM-ANCHORED COLLAPSIBLE BRACKET FOR HOLDING RACK-MOUNTABLE EQUIPMENT

BACKGROUND OF THE INVENTION

Rack-mountable equipment, including cabling junctions such as jack panels, is often mounted at a stand-off distance from a wall, ceiling or other surface or member of a building or structure. A mounting bracket with stand-off arms is typically used to achieve such stand-off mounting. The mounting bracket must be strong enough to support the mass and load of the mounted equipment, including for instance any downward gravitational torque imposed on the bracket's stand-off arms if the bracket is mounted on a wall. Wall-mount brackets with solid, fixed and rigid stand-off arms may be sufficiently strong for this purpose, but such brackets with fixed arms extending at right angles from the bracket are unchangeable both in distance between the arms and in depth along the stand-off direction, and are therefore bulky to store or ship. On the other hand, brackets with foldable stand-off arms permit folding the arms flat against the back member to decrease the depth of the bracket during storage and shipping. However, once such a foldable bracket is installed, the stand-off arms' folding mechanism such as a hinge must permanently support the weight of the stand-off arms and also the equipment mounted on those arms, all of which torques transversely against the folding mechanism as a moment arm. A folding mechanism is not as strong as a rigid member, and it may deform or fail under the weight and torque of the stand-off arms and the levered equipment.

SUMMARY OF THE INVENTION

Embodiments of the present invention pertain to a bracket with moveably connected stand-off arms that can be folded or removed for compact storage and shipping but that, once installed, rigidly and securely support their own weight and also the weight and torque of the stand-off mounted equipment. Embodiments of the present invention are directed to a bracket for holding standard-mounting-width rack-mountable equipment, including nineteen-inch rack panels and equipment capable of conforming to EIA-310, CEA-310, IEC 60297, DIN 41494 or equivalent rack mounting width standards, where the hinges or other mechanisms that connect the stand-off arms to the back member are located "inside" the span between the anchoring points of the two stand-off arms, and so those hinges or mechanisms do not have to bear the weight or gravitational torque of the stand-off arms or the mounted equipment.

According to certain embodiments, the present invention is directed to a bracket comprising a back member extending in a first direction along a mounting plane of the bracket, and the bracket comprises a first stand-off arm and a second stand-off arm that in turn each comprises a first portion capable, when the bracket is installed, of having a substantial dimension in the first direction, comprises a second portion capable, when the bracket is installed, of having a substantial dimension in a second direction normal to the first direction, is moveably attached to the back member in a manner that permits that arm to be positioned when the bracket is not installed such that its dimension in the second direction is smaller than when the bracket is installed, and comprises at least one anchor permitting attachment of at least that stand-off arm to a supporting structure. Certain other embodiments are similar to this, but do not necessarily feature anchors on the second stand-off arm.

In certain embodiments the back member is capable of being detached from the stand-off arms once the arms are attached to at least one supporting structure. In certain embodiments, when the bracket is installed, at least one anchor on the first stand-off arm and at least one anchor on the second stand-off arm are spaced substantially at a distance corresponding to the standard spacing of support members within a supporting structure to which the bracket is disposed to be mounted, and in certain of those embodiments in turn, that distance is substantially sixteen inches.

In certain embodiments at least one of the first stand-off arm and the second stand-off arm are slidably connected to the back member. In other embodiments, at least one of the first stand-off arm and the second stand-off arm are rotatably connected to the back member; in certain of these embodiments, the connection between the back member and at least one of the first stand-off arm and the second stand-off arm comprises a hinge. In certain embodiments, the installed dimension of the first stand-off arm along the mounting plane is of a different length than the installed dimension of the second stand-off arm along the mounting plane, to assist with non-interfering folding of the arms.

In certain embodiments, the anchor comprises a through-hole. In certain embodiments, the bracket comprises a recess through which cables may extend. In certain embodiments, the equipment to be mounted comprises a jack panel. In certain embodiments, the bracket comprises at least one hinge disposed to attach equipment to at least one of the first stand-off arm and the second stand-off arm.

In other embodiments, the present invention is directed to a method of installing a bracket that is disposed to mount standard-mounting-width rack-mountable equipment, including nineteen-inch rack panels and equipment capable of conforming to EIA-310, CEA-310, IEC 60297, DIN 41494 or equivalent rack mounting width standards, and that comprises a back member extending in a first direction along a mounting plane of the bracket and moveably connected to a first stand-off arm and a second stand-off arm, where the method comprises the steps of positioning each stand-off arm in a manner that increases that arm's dimension in a second direction normal to the first direction, and attaching at least each stand-off arm at at least one anchor positioned on that stand-off arm to at least one supporting structure. Certain other embodiments are similar to this, but do not necessarily include the step of attaching the second stand-off arm.

In certain embodiments, the method further comprises the step of detaching the back member from the first stand-off arm and the second stand-off arm once the first stand-off arm and the second stand-off arm have been attached.

In certain embodiments, the arm-attaching step of the method further comprises the step of extending mounting hardware through at least one through-hole located on at least one stand-off arm. In certain embodiments, the distance between the anchor where the first stand-off arm is attached to a supporting structure and the anchor where the second stand-off arm is attached to a supporting structure substantially corresponds to a standard spacing of support members within a support structure to which the bracket is disposed to be mounted.

In certain embodiments, the method further comprises the step of passing cables through a recess in the bracket. In certain embodiments, the method further comprises the step of attaching equipment to the first stand-off arm and the second stand-off arm; in certain of these embodiments the equipment comprises a jack panel. In certain embodiments the method further comprises the step of swinging equipment connected to one of the first stand-off arm or the second stand-off arm away from contact with the other stand-off arm.

In other embodiments, the present invention is directed to a bracket for holding standard-mounting-width rack-mountable equipment, including nineteen-inch rack panels and equipment capable of conforming to EIA-310, CEA-310, IEC 60297, DIN 41494 or equivalent rack mounting width standards, comprising two standing-off means, each for providing an equipment mounting location at a point offset by an offset distance from the supporting structure in a second direction normal to a first direction along a mounting plane of the bracket, with each standing-off means further comprising anchoring means for attaching at least that standing-off means to a supporting structure; comprising a spacing means for spacing at least one anchoring means in each of the two standing-off means from at least one anchoring location in another standing-off means by a spacing distance in the first direction; and comprising two attachment means, each for movably attaching one of the standing-off means to the spacing means in a manner that permits that standing-off means to be positioned when the bracket is not installed such that the dimension of that standing-off means in the second direction is smaller than when the bracket is installed. In certain of those embodiments, the spacing distance corresponds substantially to a standard spacing of support members within a supporting structure to which the bracket is disposed to be mounted.

DETAILED DESCRIPTION

Figure 1:
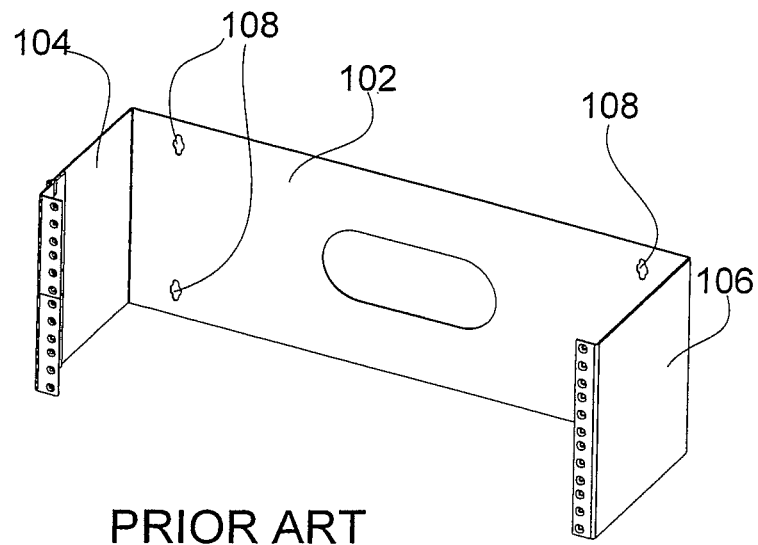
FIG. 1 is a perspective view of a prior art bracket with fixed, rigid stand-off arms.

Embodiments of the present invention are directed to a bracket that strongly and inexpensively supports the weight and torque of stand-off equipment, but which is capable of being moved into a more compact, flatter configuration for packing, storage and shipment. The advantages of embodiments of the present invention may be more distinctly seen in contrast to the prior art. FIG. 1 depicts one type of prior art stand-off bracket, a non-folding style with a back member 102 and fixed, rigid stand-off arms 104 and 106. This bracket has its anchors 108 (depicted as anchoring holes) positioned on its back member. The disadvantage of this design is that it requires a large amount of space to store or ship because it is rigid and cannot be folded down.

Figure 2:
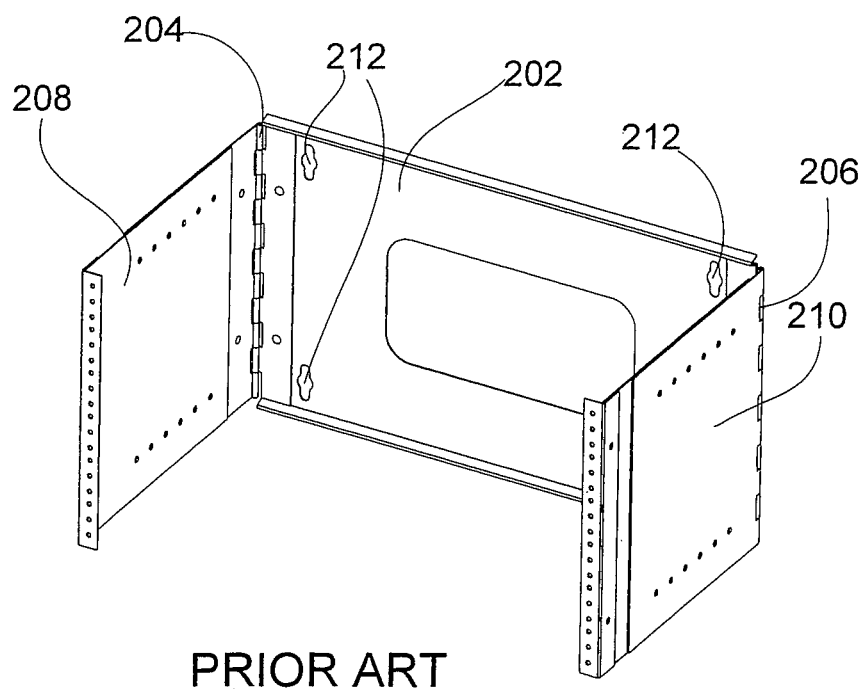
FIG. 2 is a perspective view of a prior art bracket with stand-off arms hinged at the corners.

FIG. 2 depicts another type of prior art stand-off bracket, featuring a back member 202 and folding hinges 204, 206 disposed between the back member and each stand-off arm 208, 210. This design permits folding of the stand-off arms against the back member to decrease the space necessary to store and ship the bracket. The bracket, also, has its anchoring holes 212 positioned on its back member. The disadvantage of this design is that all the downward torque from the weight of the stand-off arms and any equipment mounted to or between the stand-off arms will be transmitted to and through the corner folding hinges. It is expensive to provide a hinge mechanism of sufficient strength and quality to successfully transmit the torque from the stand-off arms and equipment to the back member and on to the supporting structure to which the bracket is mounted. If a hinge is not sufficiently strong to transmit the torque successfully, the hinge may deform or fail.

Figure 3:
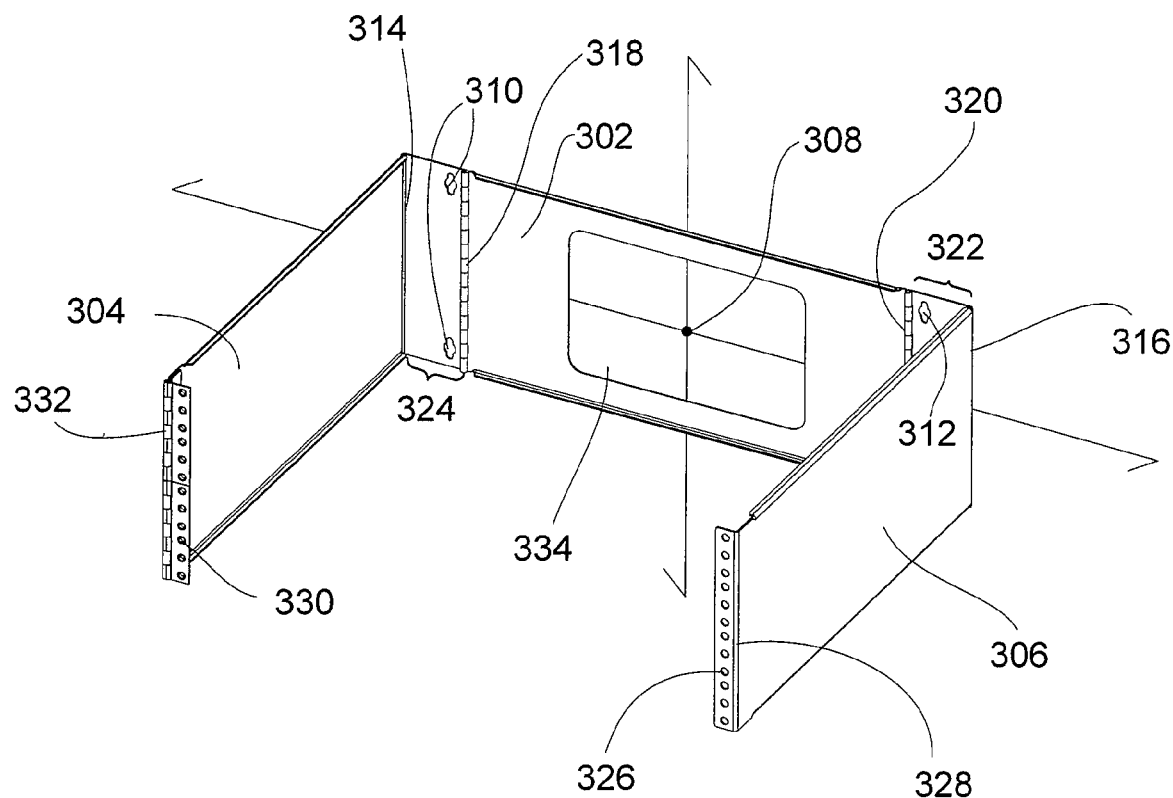
FIG. 3 is a perspective view of an embodiment of the present invention with folding stand-off arms in the installation position.

FIG. 3 depicts an embodiment of the present invention, in which a stand-off bracket comprises a back member 302 and stand-off arms 304 and 306. The bracket is disposed to be installed against a supporting structure, and the plane upon which the bracket sits when against the supporting structure defines a mounting plane 308, which may or may not physically manifest as an actual extended mounting surface (such as wall 722 in FIG. 7). In this embodiment the stand-off arms feature anchors 310, 312 and rigid perpendicular bends 314, 316. In this embodiment the bracket is installable on dry wall or other building materials or members with mounting hardware extending through the anchoring holes disposed on each of the stand-off arms. The anchors are depicted here as through-holes; such holes may for example accept separate mounting hardware, or mate with fasteners extending from the support structure. However, in addition to or instead of anchoring holes, or in addition to or instead of anchoring holes in conjunction with separate mounting hardware, any other method or mechanism for mechanical anchoring or attachment may serve as an anchor in these locations, including without limitation adhesives, hooks, bolts, brackets, clamps, clips, cotters, hook-and-loop, mollies, nails, tacks, pegs, pins, plugs, rivets, posts, screws, shafts, staples, studs, tacks, tethers, welds, or any other spot connection or fastening means or method known in the mechanical arts.

As depicted in FIG. 3, each of the stand-off arms is rotatably attached to the back member by hinges 318, 320. However, they could also be attached in other moveable ways, such as by sliding into a receiving slide rail, from which they could be removed and placed against the back member for packing, storage and shipment in a flatter configuration. In one embodiment the equipment mounting rail 326 on stand-off arm 306 is connected to the arm via rigid right-angle bend 328 while equipment mounting rail 330 on the other stand-off arm 304 is connected to the arm via hinge 332.

In certain preferred embodiments of the invention, the anchors on the two stand-off arms are spaced from each other laterally (span 716 in FIG. 7) at a standard distance, most notably sixteen inches, which is a standard spacing distance (span 720 in FIG. 7) for studs or other support members in wall construction. In certain preferred embodiments of the invention, the item(s) to be held by the bracket are standard nineteen-inch mounting width rack-mountable equipment conforming to EIA-310, CEA-310, IEC 60297, DIN 41494 or equivalent rack mounting width standards, for example jack panels (items 706, 708 in FIG. 7). The bracket's mounting length is typically slightly longer than the rack mounting length.

In these embodiments the interaction between the sixteen-inch anchor centers distance and the slightly longer nineteen-inch mounting rack centers length leads to an extending width 322, 324 of the back portion of each stand-off arm along the mounting plane 308 of the bracket on the order of just a few inches before reaching the bends 314, 316 leading into the standing off portion of each stand-off arm. Such extending back portion need not be much more than an inch and a half on each arm in order to compensate for the difference between the sixteen-inch anchoring distance and the nineteen-inch rack mounting width. This results in each stand-off arm extending from the back member only a small distance (spans 508, 510 in FIG. 5), again on the order of a little more than an inch and a half, when rotatably connected stand-off arms are rotated into their storage and shipping position.

Figure 4:
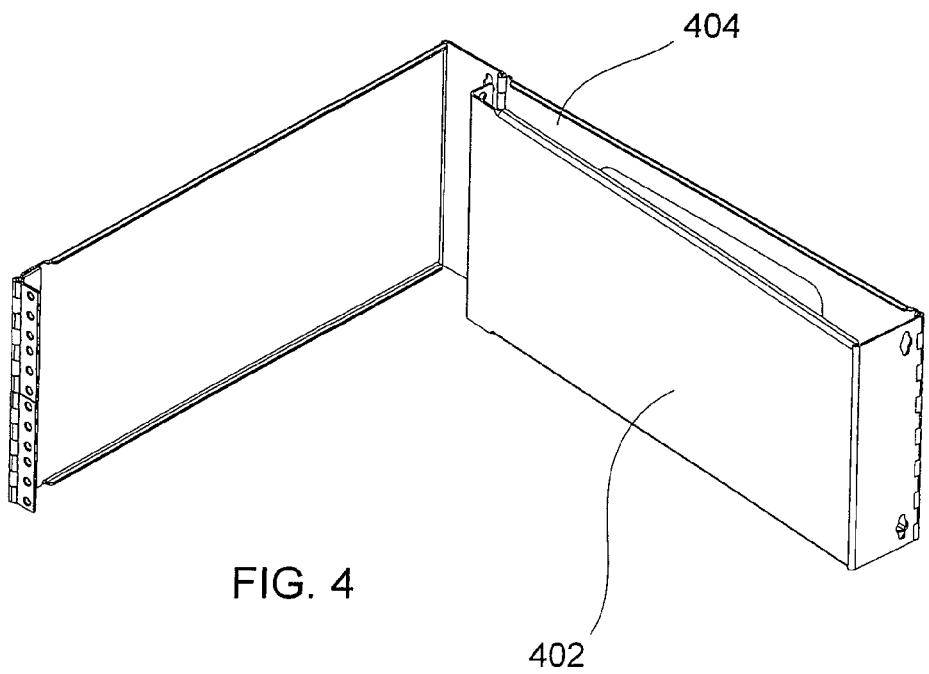
FIG. 4 is a perspective view of an embodiment of the present invention with one stand-off arm folded.
Figure 5:
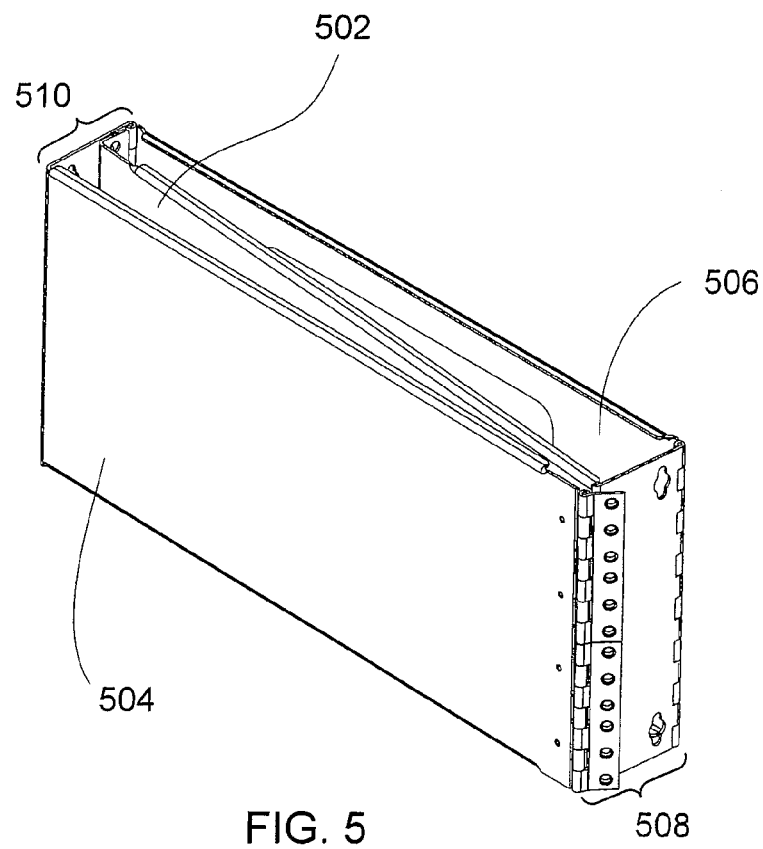
FIG. 5 is a perspective view of an embodiment of the present invention with both stand-off arms folded.

The stand-off arms in certain embodiments may be rotated on the hinges to bring the stand-off arms in toward the back member to a position contacting the back member, nearly or fully parallel to the back member, or flat against the back member, substantially decreasing the depth of the bracket for storage or shipping. FIG. 4 shows a bracket according to one embodiment with stand-off arm 402 folded in toward the back member 404, and FIG. 5 shows a bracket according to one embodiment with both of the stand-off arms 502, 504 folded in toward the back member 506. At the time a bracket in these embodiments is installed, the stand-off arms are rotated on the hinges to bring the portion of each stand-off arm on which the anchors are located into alignment with the back member and mounting plane, aligning the portion of each stand-off arm between the rigid bend and the equipment mounting point to become normal to the back member and mounting plane, as shown in FIG. 3. The length 322 of the portion of the stand-off arm that extends along the mounting plane when installed, in the folded position becomes the offset distance 508 of the folded arm from the back member 506. Similarly, length 324 of the other stand-off arm when installed, in the folded position becomes offset distance 510. In one embodiment these lengths may differ as between the two arms, in order to present different offsets from the back member when the arms are folded, leading to a more compact folded configuration.

When the bracket according to embodiments of the present invention is mounted on a wall or otherwise horizontally, gravitational torque from the weight of the stand-off arms and any mounted equipment is transmitted through the inexpensive rigid bends 314, 316 in the stand-off arms to the anchors 310, 312 located on the stand-off arms and then on to the supporting structure. Little or no torque is transmitted to or through hinges 318, 320 or other mechanism connecting the stand-off arms to the back member, or to or through back member 302 itself. Because the hinges and back member are located "inside" the anchors and do not bear weight or torque, they may comprise considerably less expensive materials and construction. While the back member may be of any strength desired, at a minimum it need only function to space and position the two stand-off arms relative to each other such that during installation the stand-off arms remain parallel to each other and the anchors on them are positioned to the proper spacing. In this way the back member prevents installation personnel from having to align the stand-off arms or measure and set the spacing between them. In another embodiment, the back member and/or the hinges or other connection mechanisms are detachable after installation.

In another embodiment the back member comprises a recess or opening 334 to accommodate the running of cables through the back member. When a recess or opening is present as well in the wall on which the bracket is mounted, this permits passage of cables from the other side of the wall, through the wall and the back member, to a stand-off wiring device. In another embodiment the recess extends the full length of the back member, and the back member accordingly comprises two pieces or bars extending laterally from one stand-off arm to the other.

Figure 6:
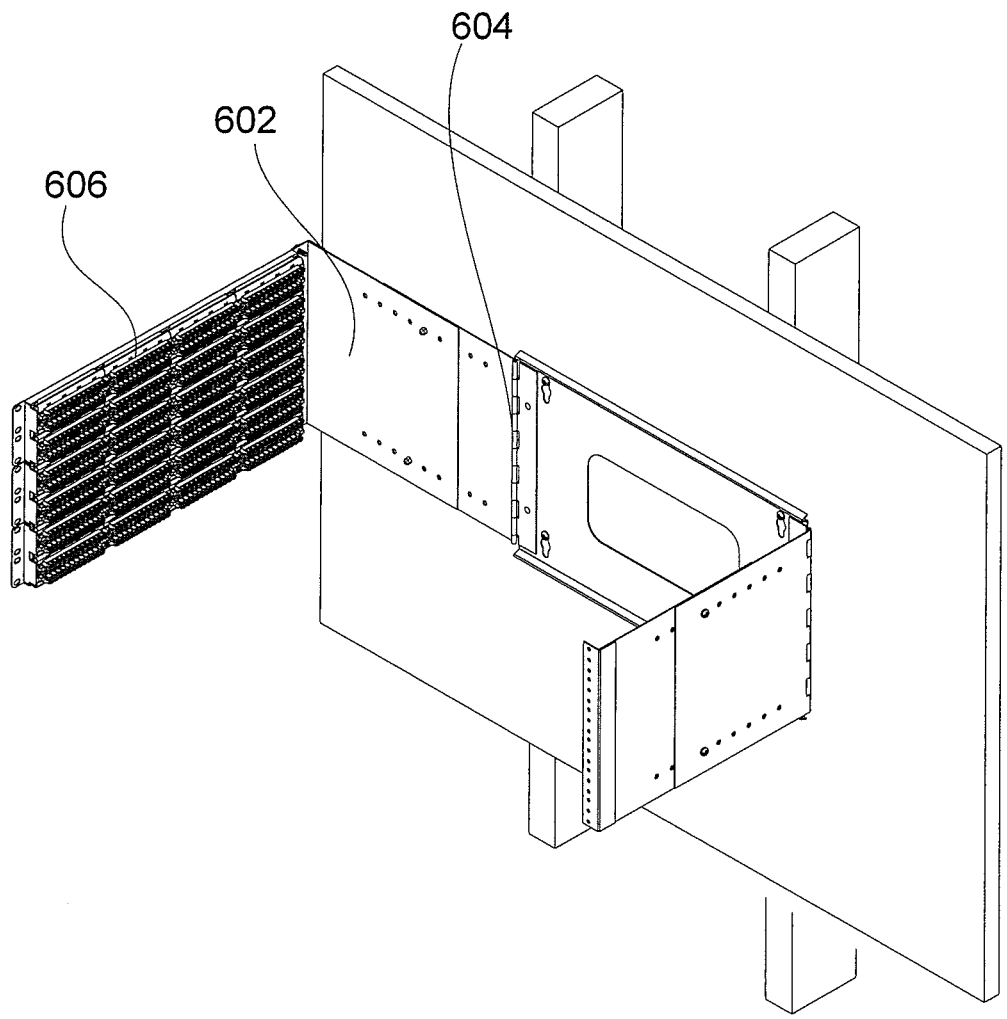
FIG. 6 is a perspective view of a prior art bracket with one of its hinged stand-off arms swung open.
Figure 7:
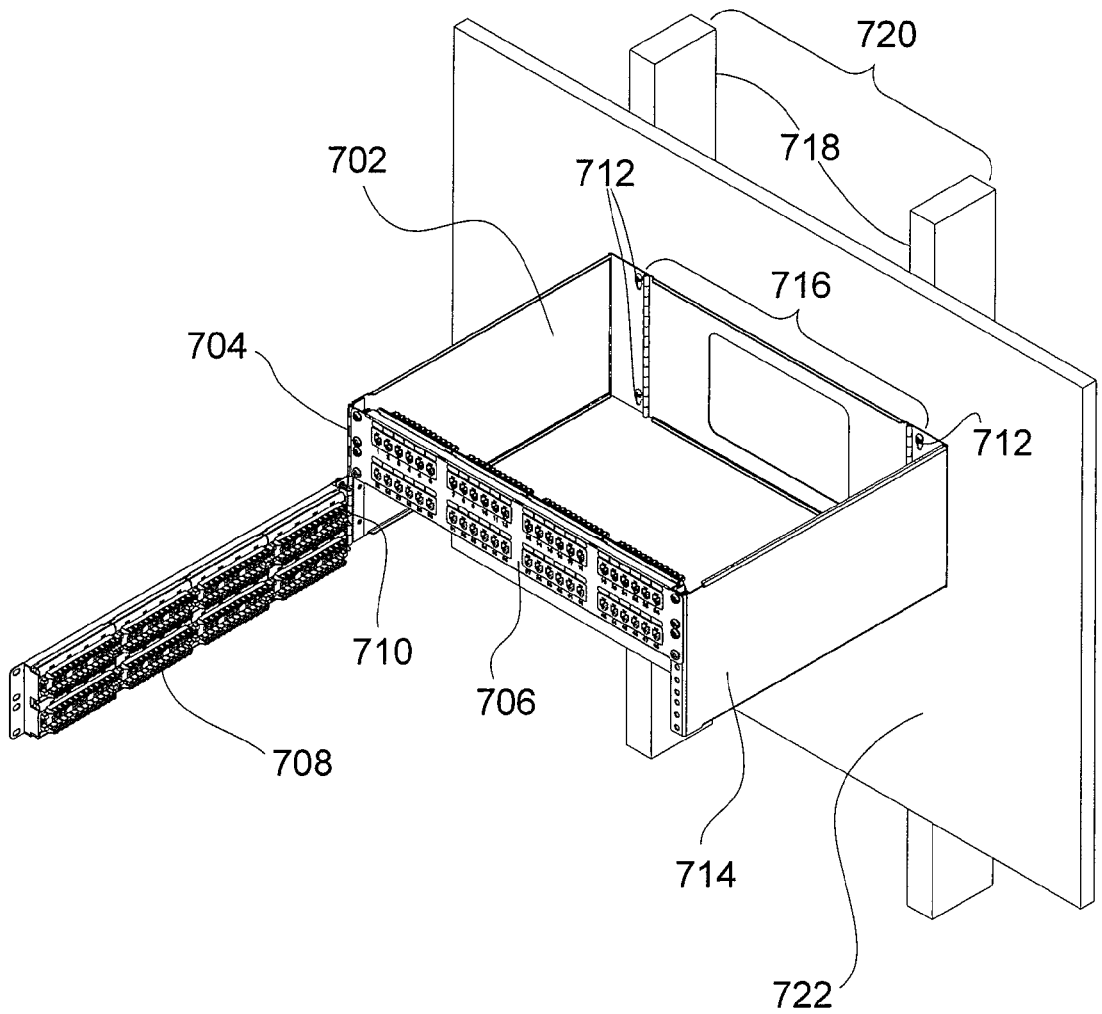
FIG. 7 is a perspective view of an embodiment of the present invention installed on a wall and studs, holding one piece of stand-off equipment fully mounted between the two stand-off arms, and having one piece of equipment swung open on one of the stand-off arms for easy access.

FIG. 6 depicts a prior art bracket with one of its hinged stand-off arms 602 swung open on hinge 604 to permit access to equipment 606 mounted on that stand-off arm. Embodiments of the present invention similarly permit the mounted equipment to be swung open to permit access for wiring or servicing. FIG. 7 shows a bracket according to one embodiment of the present invention with one of its stand-off arms 702 featuring hinges 704 and 710, through which the arm's mounting rail attaches to the rest of the stand-off arm. Equipment piece 706, depicted as a jack panel, is shown in its fully installed position, mounted to the mounting rails on both stand-off arms. Equipment piece 708, also depicted as a jack panel, is shown in its access position, swung open on hinge 710 for easy back-side access while remaining attached to stand-off arm 702. Regardless of the swinging action of hinges 704 and 710, stand-off aria 702 remains strongly and rigidly attached to the wall or other supporting structure through anchors 712. Unlike hinge 604 located at the back portion of the prior art bracket in FIG. 6, which is subject to significant deforming moment-arm leverage from the combined weight of the stand-off arm and the attached equipment, hinges 704 and 710 in this embodiment do not bear the weight of the stand-off arm and do not bear the weight of the attached equipment as torque on a lever arm. The equipment is further typically attached rigidly to the other stand-off arm 714 when fully installed, increasing the bracket's capability to bear the equipment's full weight without damaging or deforming any portion of the bracket.

In certain embodiments, as shown in FIG. 7, when the bracket is placed in the installation configuration the anchors 712 are spaced laterally on centers of a particular length 716 in order to accommodate sinking mounting hardware or other anchoring items into studs or beams 718 that are spaced at that same length 720. In one such embodiment, the anchors are spaced laterally sixteen inches apart, corresponding to construction-standard sixteen-inch stud or beam spacing.

Although limited embodiments of the present invention have been specifically described and illustrated, many modifications, combinations, and variations will be apparent to those skilled in the art. Accordingly, it is to be understood that a collapsible bracket according to the principles of this invention may be embodied other than as specifically described herein. The invention is also defined in the following claims.

What is claimed is:

1. A bracket disposed to hold equipment, said equipment capable of conforming to EIA-310, CEA-310, IEC 60297, DIN 41494 or equivalent rack mounting width standards, the bracket comprising:
   a back member extending in a first direction along a mounting plane of the bracket; and
   a first stand-off arm and a second stand-off arm that each:
      comprises a first portion that is capable, when the bracket is installed, of having a substantial dimension in the first direction;
      comprises a second portion that is capable, when the bracket is installed, of having a substantial dimension in a second direction normal to the first direction;
      is moveably attached to the back member alone a line of attachment in a manner that permits the stand-off arm to be positioned when the bracket is not installed such that the stand-off arm's dimension in said second direction is smaller than when the bracket is installed; and
      comprises at least one anchor positioned at the mounting plane of the bracket and permitting attachment of at least the stand-off arm to a supporting structure, wherein the line of attachment is between the back member and the at least one anchor in the first direction.

2. A bracket according to claim 1 wherein, when the bracket is installed, the at least one anchor positioned on the first stand-off arm at the mounting plane of the bracket and the at least one anchor positioned on the second stand-off arm at the mounting plane of the bracket are spaced substantially at a distance corresponding to a standard spacing of support members to which the bracket is disposed to be mounted.

3. A bracket according to claim 1 wherein at least one of the first stand-off arm and the second stand-off arm are rotatably connected to the back member.

4. A bracket according to claim 3 wherein the connection between the back member and the at least one of the first stand-off arm and the second stand-off arm comprises a hinge.

5. A bracket according to claim 1 wherein at least one of the first stand-off arm and the second stand-off arm are slidably connected to the back member.

6. A bracket according to claim 1 wherein the back member is capable of being detached from the first stand-off arm and the second stand-off aim once the stand-off arms are anchored to at least one supporting structure.

7. A bracket according to claim 1 wherein the anchor comprises a through-hole.

8. A bracket according to claim 1 wherein the anchor is a through-hole.

9. A bracket according to claim 1 further comprising a recess through which cables may extend.

10. A bracket according to claim 1 wherein the portion of the first stand-off arm that is capable of having a substantial dimension in the first direction when the bracket is installed has a different length in the first direction than does the portion of the second stand-off arm that is capable of having, a substantial dimension in the first direction when the bracket is installed.

11. A bracket according to claim 1 wherein at least one of the first stand-off arm and the second stand-off arm comprises a hinge capable of allowing equipment attached to a stand-off arm of the first and second stand-off arms to swing away from an equipment attachment point on the other stand-off arm of the first and second stand-off arms.

12. A method of installing a bracket that is disposed to hold equipment, said equipment capable of conforming to EIA-310, CEA-310, IEC 60297, DIN 41494 or equivalent rack mounting width standards, and that comprises a back member extending in a first direction along a mounting plane of the bracket and moveably connected along a first line of attachment to a first stand-off arm and moveably connected along a second line of attachment to a second stand-off arm, comprising the steps of:
    moving each of the stand-off arms in a manner that increases an extension of the stand-off arm in a second direction normal to the first direction;
    attaching to a supporting structure at least the first stand-off arm at at least one first anchor positioned on the first stand-off arm at the mounting plane of the bracket, the first line of attachment being between the back member and the at least one first anchor in the first direction; and
    attaching to a supporting structure at least the second stand-off arm at at least one second anchor positioned on the second stand-off arm at the mounting plane of the bracket, the second line of attachment being between the back member and the at least one second anchor in the first direction.

13. The method of claim 12 wherein, when both of the stand-off arms are attached, the at least one first anchor positioned on the first stand-off arm and the at least one second anchor positioned on the second stand-off arm are spaced substantially at to distance corresponding to a standard spacing of support members to which the bracket is disposed to be mounted.

14. The method of claim 12, further comprising the step of detaching the back member from the first stand-off arm and the second stand-off arm once the first stand-off arm and the second stand-off arm have been attached to at least one supporting structure.

15. The method of claim 12, wherein the step of attaching the first stand-off aim and the step of attaching the second stand-off arm comprise the step of extending mounting hardware through at least one through-hole located on at least one stand-off arm.

16. The method of claim 12, further comprising the step of passing cables through a recess in the bracket.

17. The method of claim 12, further comprising the step of swinging equipment connected to one of the first stand-off arm and the second stand-off arm away from contact with the other of the first stand-off arm and the second stand-off arm.

18. The method of claim 12, further comprising the step of attaching the equipment to the first stand-off arm and the second stand-off arm.

19. A bracket disposed to hold equipment, said equipment capable of conforming to EIA-310, CEA-310, IEC 60297, DIN 41494 or equivalent rack mounting width standards, the bracket comprising:
    two standing-off means, each for providing an equipment mounting location at a point offset by an offset distance from a supporting structure in a second direction normal to a first direction along a mounting plane of the bracket, each of the two standing-off means comprising at least one anchoring means positioned at the mounting plane of the bracket and for permitting attachment of the standing-off means to a supporting structure;
    a spacing means for spacing at least one anchoring means in one of the two standing-off means from the at least one anchoring means in the other of the two standing-off means by a spacing distance in the first direction; and
    two attachment means, each for movably attaching one of the standing-off means to the spacing means along a respective line of attachment in a manner that permits that standing-off means to be positioned when the bracket is not installed such that a dimension of that standing-off means in the second direction is smaller than when the bracket is installed, wherein the respective line of attachment is between the spacing means and the at least one anchoring means of the respective standing-off means in the first direction.

20. A bracket according to claim 19, wherein the spacing distance corresponds substantially to a standard spacing of support members to which the bracket is disposed to be mounted.

* * * * *